(12) United States Patent
Hars

(10) Patent No.: US 10,469,060 B1
(45) Date of Patent: Nov. 5, 2019

(54) SYNCHRONIZABLE RING OSCILLATORS

(71) Applicant: THE BOEING COMPANY, Chicago, IL (US)

(72) Inventor: Laszlo Hars, Lafayette, CO (US)

(73) Assignee: The Boeing Company, Chicago, IL (US)

( * ) Notice: Subject to any disclaimer, the term of this patent is extended or adjusted under 35 U.S.C. 154(b) by 20 days.

(21) Appl. No.: 15/853,171

(22) Filed: Dec. 22, 2017

(51) Int. Cl.
*H03K 3/03* (2006.01)
*H03K 19/20* (2006.01)
*H03L 7/24* (2006.01)
*H03K 5/159* (2006.01)

(52) U.S. Cl.
CPC ........... *H03K 3/0315* (2013.01); *H03K 5/159* (2013.01); *H03L 7/24* (2013.01); *H03K 19/20* (2013.01)

(58) Field of Classification Search
CPC .... H03K 3/0315; H03K 3/0322; H03K 5/159; H03K 19/20; H03L 7/24
USPC .......................................................... 331/57
See application file for complete search history.

(56) References Cited

U.S. PATENT DOCUMENTS

| | | | | |
|---|---|---|---|---|
| 4,891,609 A * | 1/1990 | Eilley | ..................... | H03K 3/011 331/108 A |
| 5,191,301 A * | 3/1993 | Mullgrav, Jr. | ....... | H03K 3/0231 331/108 B |
| 5,272,453 A * | 12/1993 | Traynor | ............... | H03K 3/0315 331/108 A |
| 9,531,354 B1 * | 12/2016 | Sim | ........................... | H03K 3/84 |
| 9,998,128 B2 * | 6/2018 | Grollitsch | ............. | H03L 7/0995 |
| 2004/0070459 A1 * | 4/2004 | Motoyama | ........... | H03K 3/0315 331/57 |
| 2004/0189407 A1 * | 9/2004 | Manna | ................. | H03K 3/0315 331/57 |
| 2009/0243734 A1 * | 10/2009 | Margittai | ............... | H03K 3/017 331/57 |
| 2010/0102891 A1 * | 4/2010 | Nissar | .................. | H03K 3/0315 331/57 |

(Continued)

FOREIGN PATENT DOCUMENTS

JP     2008 003047 A     1/2008

OTHER PUBLICATIONS

Extended Search Report dated May 21, 2019; European Application No. 18212558.3-1206.

(Continued)

*Primary Examiner* — Levi Gannon
(74) *Attorney, Agent, or Firm* — Womble Bond Dickinson (US) LLP

(57) ABSTRACT

Several ring oscillator constructions are provided. The ring oscillator includes a plurality of logic gates connected in a ring configuration. An output of each except a last of the plurality of logic gates is used as an input for a next one of the plurality of logic gates. The output of the last of the plurality of logic gates is fed back to and used as an input for a first of the plurality of logic gates. A logic gate of the plurality of logic gates includes an enable input to receive an enable signal to enable the logic gate and thereby the ring oscillator. The plurality of logic gates includes at least one controlled logic gate that also includes a clock input to receive a clock signal to control the at least one controlled logic gate and thereby synchronize the ring oscillator to the clock signal.

16 Claims, 5 Drawing Sheets

(56) References Cited

U.S. PATENT DOCUMENTS

| | | | | |
|---|---|---|---|---|
| 2014/0049328 A1* | 2/2014 | Smith | .................. | H03K 3/0322 |
| | | | | 331/57 |
| 2015/0358010 A1* | 12/2015 | Lee | ........................ | H03K 5/159 |
| | | | | 327/271 |
| 2016/0028379 A1* | 1/2016 | Tsubota | ................. | H03K 3/012 |
| | | | | 327/291 |
| 2019/0004562 A1* | 1/2019 | Gupta | ........................ | G06F 1/08 |

OTHER PUBLICATIONS

Gierkink S L J: "A 2.5 Gb/s Run-Length-Tolerant Burst-Mode CDR Based on a 1/8th-Rate Dual Pulse Ring Oscillator", IWWW Journal of Solid-State Circuits, IEEE Service Center, Piscataway, NJ, USA, vol. 43, No. 8, Aug. 1, 2008, pp. 1763-1771.

Dolev Danny et al.: "Rigorously modeling self-stabilizing fault-tolerant circuits: an ultra-robust clocking scheme for systems-on-chips", Journal of Computer and System Sciences, Academic Press, Inc., London, GB, vol. 80, No. 4, Jan. 15, 2014, pp. 860-900.

\* cited by examiner

SYNCHRONIZABLE RING OSCILLATORS

TECHNOLOGICAL FIELD

The present disclosure relates generally to synchronizable ring oscillators, in particular, to synchronizable ring oscillators built with standard logic gates.

BACKGROUND

Ring oscillators include logic gates or analog amplifiers connected in a loop, that is, in a ring configuration. The output of one element is connected to an input of the next. An odd number of these components invert their input signal. Ring oscillators have many uses in electronics, and they can be used as entropy sources to generate true random numbers used in information security. Synchronizable ring oscillators provide some advantages for information security applications. For example, synchronizable ring oscillators ensure stable startup conditions by running the ring oscillators in a short period when synchronizing the ring oscillators to a fixed clock frequency. In this way, the ring oscillators generate a known amount of heat, which guarantees predictable startup conditions necessary for proper operation of the ring oscillators in information security. After the ring oscillators are synchronized, the side channel leakage and interference injection sensitivity can be significantly reduced by shorter free running oscillation times in the normal (asynchronous) operation mode. Shorter free running oscillation times also improve the response time and throughput of information security applications.

One existing solution to synchronize a ring oscillator is to use operational amplifiers in the ring oscillator, and drive the non-inverting inputs of the operational amplifiers with narrow pulses derived from a clock signal. Another existing solution connects the ground lines of the input transistors of the ring gates to a wire, which is fed by pulses of the synchronization signal. However, neither of these existing solutions can be laid out by standard digital design tools in integrated circuits, sometimes referred to as chips.

Therefore it would be desirable to have a system and method that take into account at least some of the issues discussed above, as well as other possible issues.

BRIEF SUMMARY

Example implementations of the present disclosure are directed to synchronizable ring oscillators built with standard logic gates that are available in standard component libraries of integrated circuit manufacturing processes. In contrast to the existing solutions, example implementations provide synchronizable ring oscillators that are more accurate, more stable, consume less power, and with lower cost and well understood behavior.

The present disclosure thus includes, without limitation, the following example implementations.

Some example implementations provide a ring oscillator. The ring oscillators concerned in this disclosure include a plurality of logic gates connected in a ring configuration in which an output of each except a last of the plurality of logic gates is used as an input for a next one of the plurality of logic gates, the output of the last of the plurality of logic gates being fed back to and used as an input for a first of the plurality of logic gates. The plurality of logic gates includes at least one controlled logic gate that also includes a clock input configured to receive a clock signal to control the at least one controlled logic gate and thereby synchronize the ring oscillator to the clock signal. A logic gate of the plurality of logic gates includes an enable input configured to receive an enable signal to enable the logic gate and thereby the ring oscillator.

In some example implementations of the ring oscillator of any preceding example implementation, or any combination of preceding example implementations, the plurality of logic gates includes an odd number of inverting logic gates connected in the ring configuration, and wherein the at least one controlled logic gate has an enable input that is the clock input configured to receive the clock signal.

In some example implementations of the ring oscillator of any preceding example implementation, or any combination of preceding example implementations, the at least one controlled logic gate includes a differential buffer gate having a non-inverted input and an inverted input, and at least an inverted output, the non-inverted input being connected to an output of a previous one of the plurality of logic gates in the ring configuration, the inverted input being the clock input, and the inverted output being connected to an input for a next one of the plurality of logic gates in the ring configuration.

In some example implementations of the ring oscillator of any preceding example implementation, or any combination of preceding example implementations, the at least one controlled logic gate includes a tri-state inverter having an input connected to an output of a previous one of the plurality of logic gates in the ring configuration, an inverted output connected to an input of a next one of the plurality of logic gates in the ring configuration, and an enable input that is the clock input.

In some example implementations of the ring oscillator of any preceding example implementation, or any combination of preceding example implementations, the at least one controlled logic gate includes a gated D-latch having a data input and an enable input, and at least an inverted output, the data input being connected to an output of a previous one of the plurality of logic gates in the ring configuration, the enable input being the clock input, and the inverted output being connected to an input for a next one of the plurality of logic gates in the ring configuration.

In some example implementations of the ring oscillator of any preceding example implementation, or any combination of preceding example implementations, the at least one controlled logic gate includes a 2:1 multiplexer connected between consecutive logic gates of the plurality of logic gates in the ring configuration, the 2:1 multiplexer having a first input and a second input, a selector input and an output, the first input being connected to an output of an earlier one of the consecutive logic gates in the ring configuration, the selector input being the clock input, and the output being both connected to an input for a later one of the consecutive logic gates in the ring configuration, and fed back and connected to the second input of the 2:1 multiplexer.

In some example implementations of the ring oscillator of any preceding example implementation, or any combination of preceding example implementations, each of the plurality of logic gates causes a gate delay in signal propagation within the ring oscillator, and the clock signal includes a periodic train of pulses having a pulse-width that is the gate delay or a multiple of the gate delay caused by the at least one controlled logic gate.

In some example implementations of the ring oscillator of any preceding example implementation, or any combination of preceding example implementations, the clock signal has a clock frequency, and the ring oscillator is configured to oscillate at a frequency that is the clock frequency or a multiple of the clock frequency.

In some example implementations of the ring oscillator of any preceding example implementation, or any combination of preceding example implementations, the at least one controlled logic gate is multiple controlled logic gates each of which includes a respective clock input configured to receive the clock signal to control the multiple controlled logic gates and thereby synchronize the ring oscillator to the clock signal.

Some example implementations provide a method of synchronizing a ring oscillator. The method comprises receiving an enable signal at an enable input of a logic gate of a plurality of logic gates of the ring oscillator, the plurality of logic gates being connected in a ring configuration in which an output of each except a last of the plurality of logic gates is used as an input for a next one of the plurality of logic gates, the output of the last of the plurality of logic gates being fed back to and used as an input for a first of the plurality of logic gates, the enable signal enabling the logic gate and thereby the ring oscillator; receiving a clock signal at a clock input of at least one controlled logic gate of the plurality of logic gates; and using the clock signal to control the at least one controlled logic gate and thereby synchronize the ring oscillator to the clock signal.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
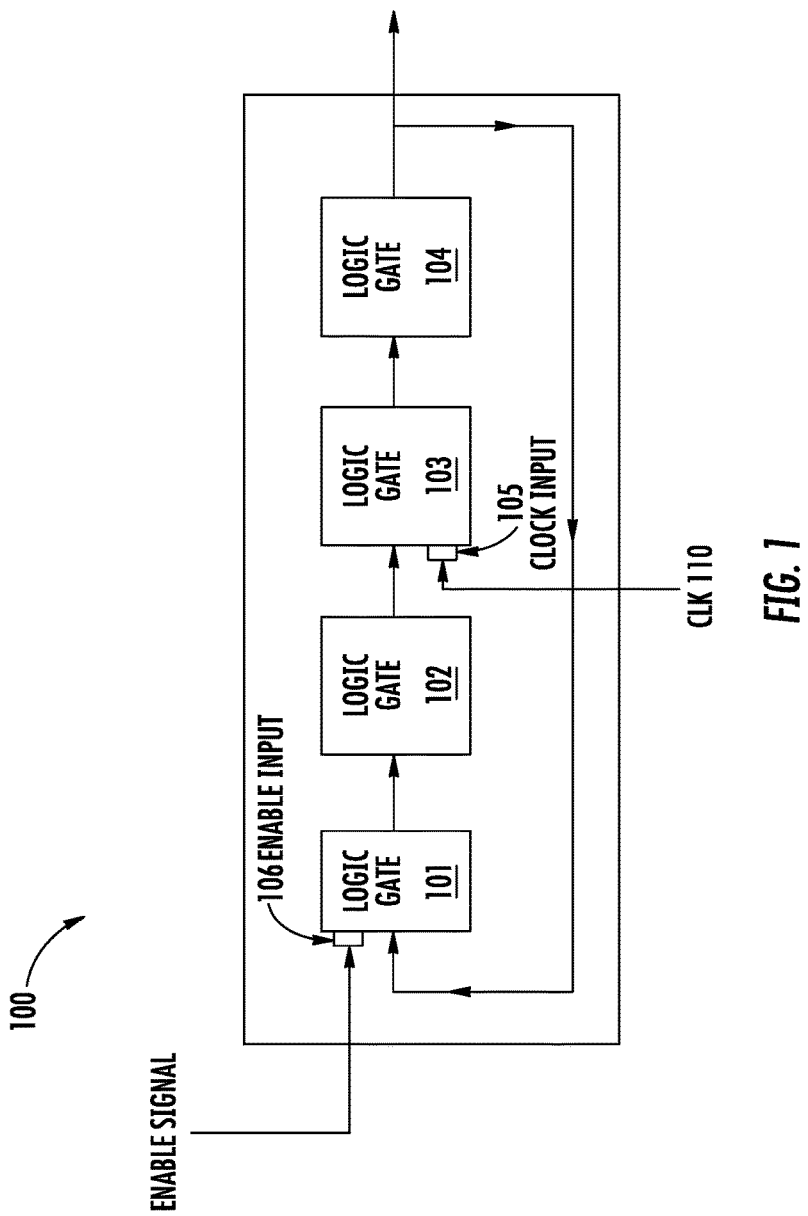
FIG. 1 illustrates a synchronizable ring oscillator according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure are generally directed to synchronizable ring oscillators, in particular, to synchronizable ring oscillators built with standard logic gates. Ring oscillators can be used as entropy sources to generate true random numbers used in information security. For example, the output of the ring oscillator can be sent to a counter to generate entropy values or true random numbers by counting oscillation periods in a predefined time period. In some applications, the generated true random numbers can be used as a seed for a pseudorandom number generator to generate cryptographic keys used in secure applications of a computer system. Other applications include ring based physical unclonable function (PUF) devices or signal generation of predictable frequencies.

FIG. 1 illustrates a synchronizable ring oscillator 100 according to example implementations of the present disclosure. In some examples, the ring oscillator includes a plurality of logic gates connected in a ring configuration, e.g., the logic gates 101-104, as shown. In the ring configuration, an output of each except a last of the plurality of logic gates is used as an input for a next one of the plurality of logic gates. For example, as shown, the output of the logic gate 101 is used as an input for the logic gate 102, and the output of the logic gate 102 is used as an input for the logic gate 103. Also, in the ring configuration, the output of the last of the plurality of logic gates is fed back to and used as an input for a first of the plurality of logic gates. For example, the output of the last logic gate 104 in the series is fed back to and used as an input for the first logic gate 101 in the series.

In some examples, a logic gate of the plurality of logic gates includes an enable input configured to receive an enable signal to enable the logic gate and thereby the ring oscillator. For example, the first logic gate of the ring oscillator, e.g., the logic gate 101, also has an enable input 106 to receive an enable signal to start and stop the oscillation of the ring oscillator. The enable input can start or stop the oscillator, by any means known in the art, including the use of a NAND or NOR gate or a latch among the logic gates of the ring oscillator, with an input that starts or stops the oscillation. The enable signal can be provided to any of the logic gates 101-104.

In some examples, the plurality of logic gates includes at least one controlled logic gate. The at least one controlled logic gate includes a clock input configured to receive a clock signal to control the at least one controlled logic gate and thereby synchronize the ring oscillator to the clock signal. For example, as shown, the at least one controlled logic gate can be the logic gate 103. The logic gate 103 includes a clock input 105 configured to receive the clock signal 110 to control the logic gate and thereby synchronize the ring oscillator 100 to the clock signal. In another example, the at least one controlled logic gate can be a different logic gate, e.g. the logic gate 101 or 102.

In one example, the clock signal 110 can be narrow clock pulses. When the clock signal is at logic level 1, the clock signal can block the change of the output of the at least one controlled logic gate, e.g., the logic gate 103. On the other hand, when the clock signal is at logic level 0, the output of the controlled logic gate is not affected by the clock signal.

In one example, when the clock signal 110 at logic level 1 arrives at the input of the controlled logic gate 103, if the controlled logic gate does not switch during the whole period when the clock signal is at logic level 1, the clock signal does not affect the output of the controlled logic gate. This is because if the controlled logic gate does not switch, there is no change of output to be blocked.

On the other hand, if the controlled logic gate 103 switches during the whole period when the clock signal 110 is at logic level 1, the corresponding change of the output of the controlled logic gate is blocked. That is, the signal going to the next logic gate, e.g., the logic gate 104, is held at the previous level. Only when the clock signal is changed from logic level 1 to logic level 0, the output of the controlled logic gate is allowed to reach the next logic gate in the ring. In this way, the output of the controlled logic gate is synchronized to the falling edge (changing from logic level 1 to logic level 0) of the clock signal. In another example, the output of the controlled logic gate can be synchronized to the rising edge (changing from logic level 0 to logic level 1) of the clock signal.

In some examples, the plurality of logic gates includes an odd number of inverting logic gates connected in the ring configuration. For example, the logic gate 101 can be an inverting logic gate, e.g., an inverter. In another example, the logic gates 101, 120 and 103 can be inverting logic gates. The at least one controlled logic gate, e.g., the logic gate 103, has an enable input that is the clock input 105 configured to receive the clock signal 110. The at least one controlled logic gate may or may not be an inverting logic gate. In one example, the output and/or one or more of the inputs of the controlled logic gate can be modified from inverted to non-inverted or vice versa. The ring oscillator 100 can operate normally as long as there is an odd number of inverting logic gates in the ring oscillator.

Figure 2A:
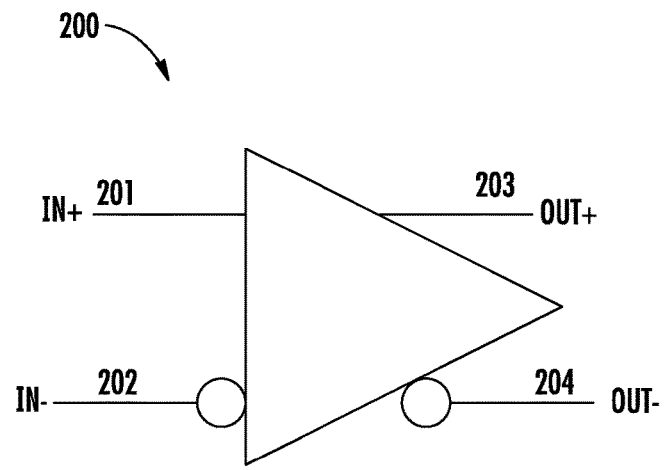
FIGS. 2A, 2B, 2C and 2D illustrate logic gates used to synchronize the ring oscillator, according to various example implementations.

In some examples, the at least one controlled logic gate, e.g., the logic gate 103, includes a differential buffer gate (as shown in FIG. 2A below) having a non-inverted input and an inverted input, and at least an inverted output. The non-inverted input is connected to an output of a previous one of the plurality of logic gates in the ring configuration, e.g., the output of the logic gate 102. The inverted input is the clock input 105. The inverted output is connected to an input for a next one of the plurality of logic gates in the ring configuration, e.g., the input of the logic gate 104.

Figure 2B:
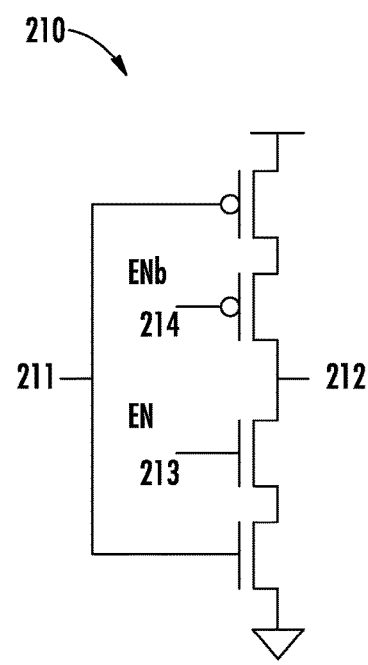

In some examples, the at least one controlled logic gate, e.g., the logic gate 103, includes a tri-state inverter (as shown in FIG. 2B below). The tri-state inverter has an input connected to an output of a previous one of the plurality of logic gates in the ring configuration. The tri-state inverter also has an inverted output connected to an input of a next one of the plurality of logic gates in the ring configuration, and an enable input that is the clock input 105.

Figure 2C:
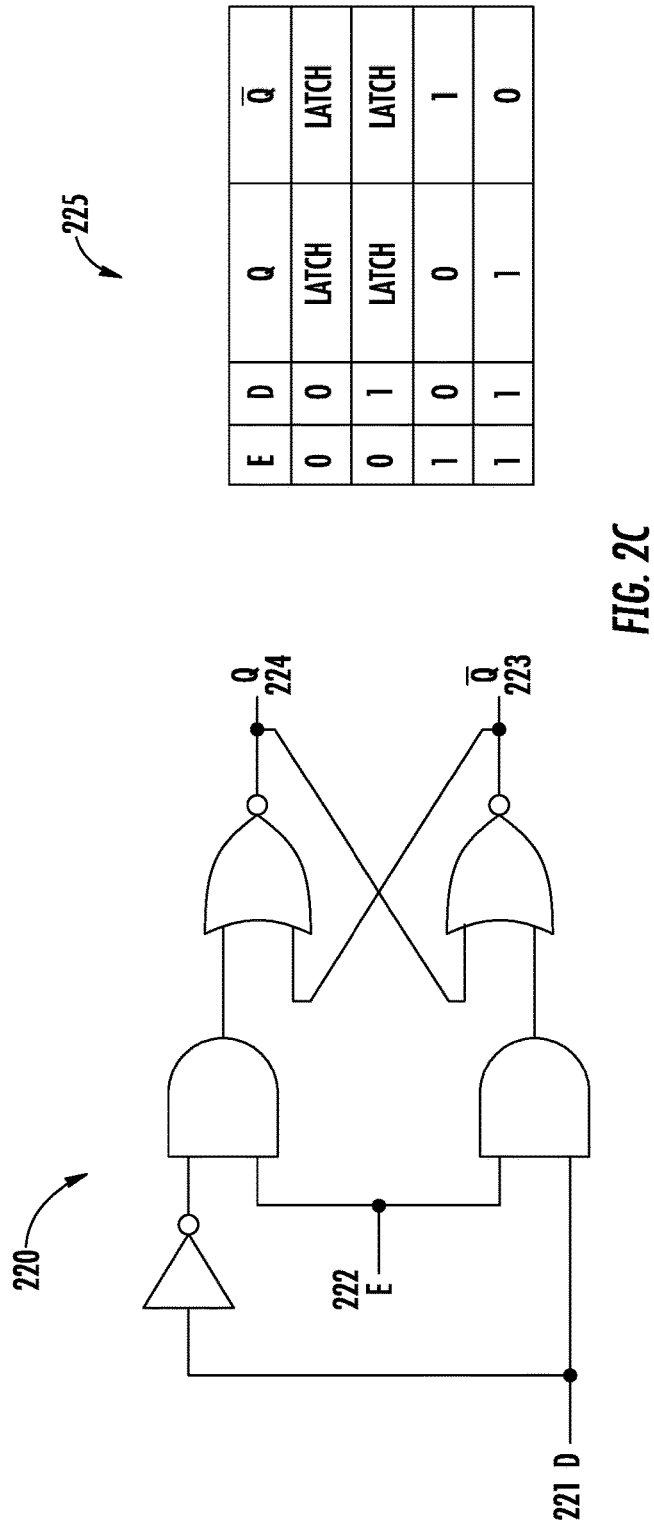

In some examples, the at least one controlled logic gate, e.g., the logic gate 103, includes a gated D-latch (as shown in FIG. 2C below). The gated D-latch has a data input and an enable input, and at least an inverted output. The data input is connected to an output of a previous one of the plurality of logic gates in the ring configuration. The enable input is the clock input 105. The inverted output is connected to an input for a next one of the plurality of logic gates in the ring configuration.

Figure 2D:
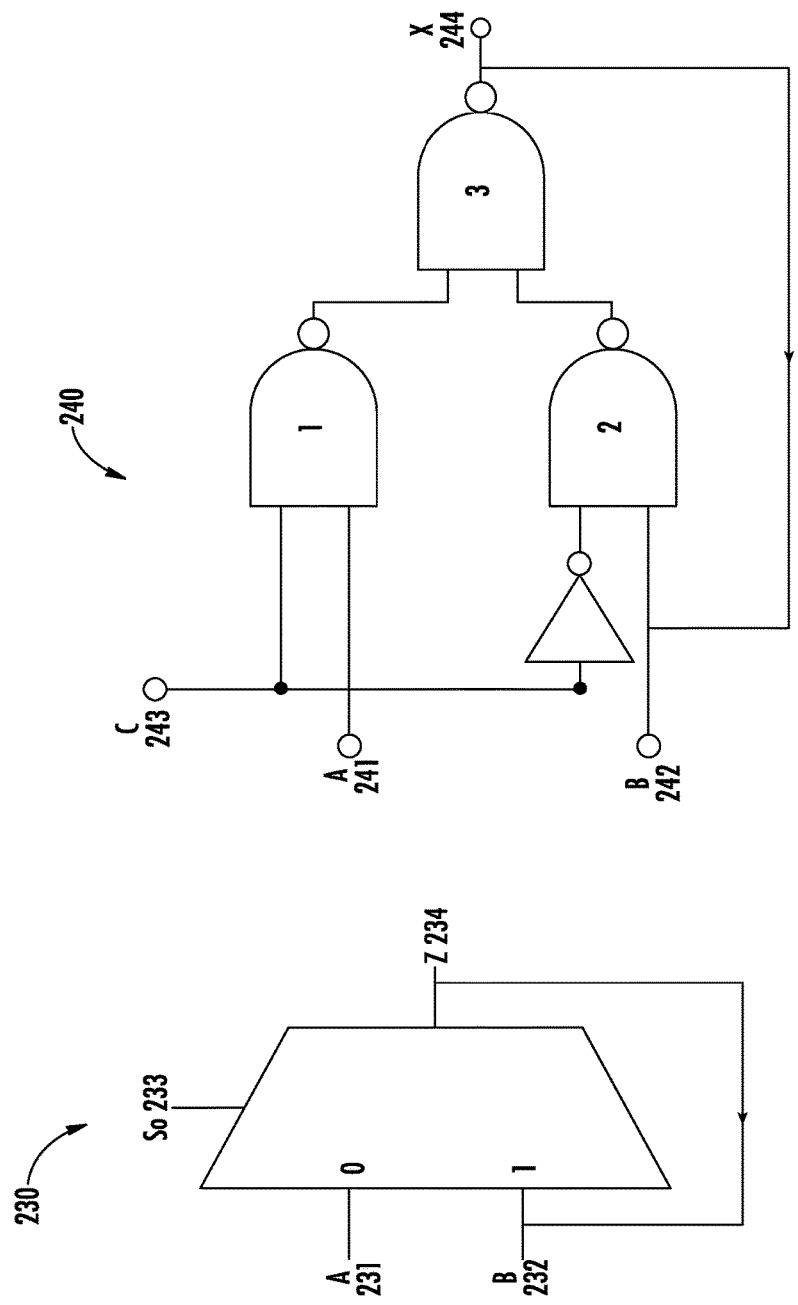

In some examples, the at least one controlled logic gate, e.g., the logic gate 103, includes a 2:1 multiplexer (as shown in FIG. 2D below) connected between consecutive logic gates of the plurality of logic gates in the ring configuration. For example, the 2:1 multiplexer can be a part of the logic gate 103 or inserted between the consecutive logic gates 103 and 104. The 2:1 multiplexer has a first input and a second input, a selector input and an output. The first input is connected to an output of an earlier one of the consecutive logic gates in the ring configuration, e.g., the output of the logic gate 103. The selector input is the clock input. The output is connected to an input for a later one of the consecutive logic gates in the ring configuration, e.g., the input of the logic gate 104. The output is also fed back and connected to the second input of the 2:1 multiplexer.

In some examples, each of the plurality of logic gates causes a gate delay in signal propagation within the ring oscillator 100. The clock signal 110 includes a periodic train of pulses having a pulse-width that is the gate delay or a multiple of the gate delay caused by the at least one controlled logic gate, e.g., the logic gate 103. In one example, if the controlled logic gate 103 is a regular inverting logic gate, the pulse-width of the clock signal can be equal to the delay of the inverting logic gate. In another example, if the controlled logic gate 103 is a very fast inverting logic gate, the pulse-width of the clock signal can be 2 or 3 times of the delay of the very fast inverting logic gate. At synchronization there is a slight pulse width phase modulation of the oscillation signal of the ring oscillator, which is equal or less than the pulse-width of the clock signal.

In some examples, the clock signal 110 has a clock frequency, and the ring oscillator 100 is configured to oscillate at a frequency that is the clock frequency or a multiple of the clock frequency. The free running oscillation frequency of the ring oscillator is constrained by technological limits. For example, the oscillation frequency of the ring oscillator may be restricted to 1, 2, . . . , 40 times of the clock frequency of the clock signal in the 32 nm Silicon-On-Insulator (SOI) technology. Other chip manufacturing technologies may require slightly different maximum allowable oscillation frequency. In another example, if the goal is to generate a signal of a frequency coupled to the clock signal by a fixed frequency ratio in the whole range of environmental conditions, the ring oscillator may be designed at a much lower free running frequency such as at most 4 times of the clock frequency of the clock signal.

In some examples, the at least one controlled logic gate is multiple controlled logic gates each of which includes a respective clock input 105 configured to receive the clock signal 110 to control the multiple controlled logic gates and thereby synchronize the ring oscillator 100 to the clock signal. For example, multiple or all of the logic gates 101-104 can include the clock input and receive the clock signal. In one example, the clock signal needs to arrive at the multiple logic gates of the ring oscillator at the same time. To achieve this, the clock signal can be distributed to the multiple logic gates using a tree structure of buffers. In this example, there is no requirement about the delay of this tree, other than it needs to be uniform at each terminal node, i.e., at each of the multiple logic gates.

FIGS. 2A, 2B, 2C and 2D illustrate the controlled logic gate 103 used to synchronize the ring oscillator 100, according to various example implementations.

In some examples, the controlled logic gate 103 includes a differential buffer gate 200, as shown in FIG. 2A. In these examples, the differential buffer gate is an inverting logic gate. The differential buffer gate includes a non-inverted input 201 and an inverted input 202, a non-inverted output 203 and inverted output 204. The non-inverted input is connected to an output of a previous one of the plurality of logic gates in the ring, e.g., the output of the logic gate 102. The inverted input is the clock input 105 to receive the clock signal 110. The non-inverted output can be floating. The inverted output is connected to an input for a next one of the plurality of logic gates, e.g., the input of the logic gate 104. In another example, the differential buffer gate does not have the non-inverted output.

In one example, if the clock signal 110 received at the inverted input 202 is at logic level 1 or close to the supply voltage, the next logic gate 104 does not react to any changes on the inverted output 204 of the differential buffer gate 200. If the clock signal received at the inverted input is at logic level 0 or at a voltage level close to the ground, the ring oscillator 100 functions normally. Accordingly, connecting the inverted input of the differential buffer gate 200 to the clock signal of short pulses synchronizes the ring oscillator to the falling edges of the clock signal. In this example, an extra synchronizing delay is introduced at one or more logic gates (possibly not the controlled logic gate) which would switch closest to the clock pulse. Other logic gates of the ring oscillator may not be affected.

In some examples, the controlled logic gate 103 includes a tri-state inverter 210, as shown in FIG. 2B. In these examples, the tri-state inverter includes an input 211 connected to an output of a previous one of the plurality of logic gates in the ring, e.g., the output of the logic gate 102. The tri-state inverter also includes an inverted output 212 connected to an input of a next one of the plurality of logic gates, e.g., the input of the logic gate 104. The tri-state inverter further includes an enable input 213 that is the clock input 105 to receive the clock signal 110. The received clock signal can be inverted to get the signal ENb 214 to drive the tri-state inverter.

In one example, when the received clock signal 110 is at logic level 1, the ENb 214 is at logic level 0, the inverted output 212 is at high impedance and in a floating state. In this case, if the clock signal includes a pulse that is short enough, the input capacitance of the next logic gate 104 has no time to discharge, therefore the next logic gate 104 retains its previous on/off state. On the other hand, when the received clock signal is at logic level 0, the ENb is at logic level 1, the tri-state inverter behaves like a regular inverter. In this case, the inverted output is connected directly to the input of the next logic gate 104. Accordingly, connecting the enable input 213 of the tri-state inverter 210 to the clock signal of short pulses synchronizes the ring oscillator 100 to the falling edges of the clock signal. In this example, an extra synchronizing delay is introduced at one or more logic gates (possibly not the controlled logic gate) which would switch closest to the clock pulse. Other logic gates of the ring oscillator may not be affected.

In some examples, the controlled logic gate 103 includes a gated D-latch 220, as shown in FIG. 2C. In these examples, the gated D-latch is an inverting logic gate. The gated D-latch includes a data input 221 and an enable input 222, an inverted output 223 and a non-inverted output 224. The data input is connected to an output of a previous one of the plurality of logic gates in the ring, the output of the logic gate 102. The enable input is the clock input 105 to receive the clock signal 110. The inverted output is connected to an input for a next one of the plurality of logic gates in the ring, e.g., the input of the logic gate 104. The non-inverted output can be floating.

In one example, as shown in table 225, when the enable input 222 (E) is at logic level 0, the inverted output 223 (Q) is latched and does not react to any changes on the data input 221 (D). On the other hand, when the enable input (E) is at logic level 1, the inverted output Q has the inverted value of the data input (D), like a regular inverter. Accordingly, connecting the enable input of the gated D-latch 220 to the clock signal of short pulses synchronizes the ring oscillator 100 to the rising edges of the clock signal. In this example, the gated D-latch can replace the regular inverter in the ring oscillator 100. The gated D-latch has the advantage that it has been optimized to get metastable rarely, therefore it produces cleaner frequency spectra.

In some examples, the controlled logic gate 103 includes a 2:1 multiplexer 230 or 240, as shown in FIG. 2D. The 2:1 multiplexer is connected between consecutive logic gates of the plurality of logic gates in the ring. For example, the 2:1 multiplexer can be a part of the logic gate 103 or inserted between the consecutive logic gates 103 and 104. The 2:1 multiplexer 230 has a first input 231 and a second input 232, a selector input 233 and an output 234. The first input is connected to an output of an earlier one of the consecutive logic gates in the ring, e.g., the output of the logic gate 103. The selector input is the clock input 105. The output is connected to an input for a later one of the consecutive logic gates in the ring, e.g., the input of the logic gate 104. The output is also fed back and connected to the second input of the 2:1 multiplexer.

Similarly, the 2:1 multiplexer 240 has a first input 241 and a second input 242, a selector input 243 and an output 244. The first input, second input, selector input and output can be arranged similarly as the 2:1 multiplexer 230.

In one example, for the 2:1 multiplexer 230, when the selector input 233 is at logic level 1, the 2:1 multiplexer becomes a latch and the output 234 is the same as the second input 232. In this case, the current level of the output is kept and the effects of any changes on the first input 231 are blocked. On the other hand, when the selector input is at logic level 0, the first input is allowed to propagate to the output at a delay of at most the width of the clock pulse. That is, the ring oscillator 100 works normally. Accordingly, connecting the selector input of the 2:1 multiplexer 230 to the clock signal of short pulses synchronizes the ring oscillator 100 to the falling edges of the clock signal. The 2:1 multiplexer 240 can be used to synchronize the ring oscillator to the falling edges of the clock signal similarly.

The differential buffer gate 200, tri-state inverter 210, gated D-latch 220 or 2:1 multiplexer 230 or 240 used in the synchronizable ring oscillator 100 may be available in standard component libraries of integrated circuit manufacturing processes. Thus, in contrast to the existing solutions, the synchronizable ring oscillator are more accurate, more stable, and with lower cost and well understood behavior.

Figure 3:
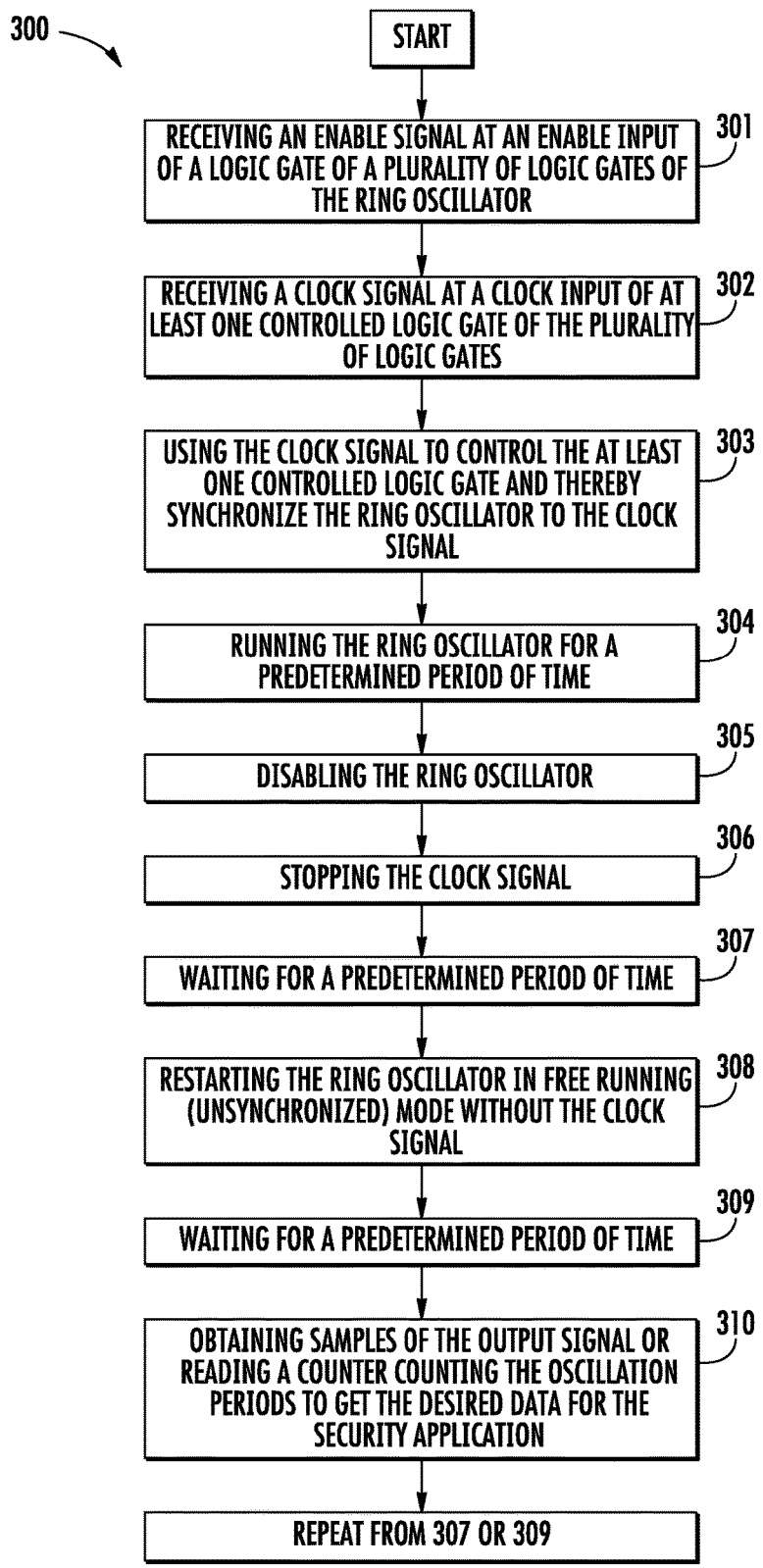
FIG. 3 is a flowchart illustrating various steps in a method of synchronizing a ring oscillator according to various example implementations.

FIG. 3 is a flowchart illustrating various steps in a method 300 of synchronizing the ring oscillator 100 according to various example implementations. At block 301, the method includes receiving an enable signal at an enable input 106 of a logic gate of a plurality of logic gates 101-104 of the ring oscillator. The plurality of logic gates is connected in a ring configuration. An output of each except a last of the plurality of logic gates is used as an input for a next one of the plurality of logic gates. The output of the last of the plurality of logic gates is fed back to and used as an input for a first of the plurality of logic gates. The enable signal enables the logic gate and thereby the ring oscillator. At block 302, the method includes receiving a clock signal 110 at a clock input 105 of at least one controlled logic gate 103 of the plurality of logic gates. At block 303, the method includes using the clock signal to control the at least one controlled logic gate and thereby synchronize the ring oscillator to the clock signal.

In some examples, the method may include blocks 304-310 for security application. At block 304, the method includes running or operating the ring oscillator for a predetermined period of time. At block 305, the method includes disabling the ring oscillator by removing the enable signal. At block 306, the method includes stopping or removing the clock signal. At block 307, the method includes waiting for a predetermined period of time. At block 308, the method includes restarting the ring oscillator in free running (unsynchronized) mode without the clock signal. At block 309, the method includes waiting for a predetermined period of time. At block 310, the method includes obtaining samples of the output signal or reading a counter counting the oscillation periods to get the desired data (e.g., true random numbers) for the security application. After block 310, the method can repeat from block 307 or 309 as desired.

The synchronizable ring oscillator 100 can be used to generate known and controllable amount of heat, and to enforce predictable circuit temperatures. The ring oscillator is synchronized to a stable clock signal to avoid the problem of unpredictable oscillation frequencies, which may be the result of multiple equilibria of frequencies and the corresponding die temperatures, due to the non-monotonic dependencies of gate delays from the die temperature. The synchronizable ring oscillator can also be used to build frequency multiplier signal generators. In these signal generator designs a clock signal periodically adjusts the phase of the oscillation signal. The resulting phase synchronization ensures that the ratio of the frequency of the clock signal and the frequency of the ring oscillator remains stable. Synchronized oscillators follow small frequency changes of the clock signal, thereby phase and frequency modulation can be achieved in the resulting oscillation signal by modulating the clock phase or frequency. Multiple synchronizable ring oscillators can synchronize to the same clock signal, and so the signal generator can generate multiple stable signals. Each of the multiple stable signals can be modulated in the same way as the clock signal, but at a different carrier frequency.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A ring oscillator comprising:
a plurality of logic gates connected in a ring configuration in which an output of each of the plurality of logic gates is used as an input for a next one of the plurality of logic gates, the output of the last of the plurality of logic gates being fed back to and used as an input for a first of the plurality of logic gates, a logic gate of the plurality of logic gates including an enable input configured to receive an enable signal to enable the logic gate and thereby the ring oscillator,
wherein the plurality of logic gates includes at least one controlled logic gate that also includes a clock input configured to receive a clock signal to control the at least one controlled logic gate and thereby synchronize the ring oscillator to the clock signal, wherein each of the plurality of logic gates causes a gate delay in signal propagation within the ring oscillator, and the at least one controlled logic gate being controlled by the clock signal including a periodic train of pulses having a pulse-width that is the gate delay or an integer multiple of the gate delay caused by the at least one controlled logic gate.

2. The ring oscillator of claim 1, wherein the plurality of logic gates includes an odd number of inverting logic gates connected in the ring configuration, and
wherein the at least one controlled logic gate has an enable input that is the clock input configured to receive the clock signal.

3. The ring oscillator of claim 1, wherein the at least one controlled logic gate includes a differential buffer gate having a non-inverted input and an inverted input, and at least an inverted output, the non-inverted input being connected to an output of a previous one of the plurality of logic gates in the ring configuration, the inverted input being the clock input, and the inverted output being connected to an input for a next one of the plurality of logic gates in the ring configuration.

4. The ring oscillator of claim 1, wherein the at least one controlled logic gate includes a tri-state inverter having an input connected to an output of a previous one of the plurality of logic gates in the ring configuration, an inverted output connected to an input of a next one of the inverting logic gates in the ring configuration, and an enable input that is the clock input.

5. The ring oscillator of claim 1, wherein the at least one controlled logic gate includes a gated D-latch having a data input and an enable input, and at least an inverted output, the data input being connected to an output of a previous one of the plurality of logic gates in the ring configuration, the enable input being the clock input, and the inverted output being connected to an input for a next one of the plurality of logic gates in the ring configuration.

6. The ring oscillator of claim 1, wherein the at least one controlled logic gate includes a 2:1 multiplexer connected between consecutive logic gates of the plurality of logic gates in the ring configuration, the 2:1 multiplexer having a first input and a second input, a selector input and an output, the first input being connected to an output of an earlier one of the consecutive logic gates in the ring configuration, the selector input being the clock input, and the output being both connected to an input for a later one of the consecutive logic gates in the ring configuration, and fed back and connected to the second input of the 2:1 multiplexer.

7. The ring oscillator of claim 1, wherein the clock signal has a clock frequency, and the ring oscillator is configured to oscillate at a frequency that is the clock frequency or a multiple of the clock frequency.

8. The ring oscillator of claim 1, wherein the at least one controlled logic gate is multiple controlled logic gates each of which includes a respective clock input configured to receive the clock signal to control the multiple controlled logic gates and thereby synchronize the ring oscillator to the clock signal.

9. A method of synchronizing a ring oscillator, comprising:
receiving an enable signal at an enable input of a logic gate of a plurality of logic gates of the ring oscillator, the plurality of logic gates being connected in a ring configuration in which an output of each of the plurality of logic gates is used as an input for a next one of the plurality of logic gates, the output of the last of the plurality of logic gates being fed back to and used as an input for a first of the plurality of logic gates, the enable signal enabling the logic gate and thereby the ring oscillator; receiving a clock signal at a clock input of at least one controlled logic gate of the plurality of logic gates; and
using the clock signal to control the at least one controlled logic gate and thereby synchronize the ring oscillator to the clock signal, wherein each of the plurality of logic gates causes a gate delay in signal propagation within the ring oscillator, and the at least one controlled logic gate being controlled by the clock signal including a periodic train of pulses having a pulse-width that is the gate delay or an integer multiple of the gate delay caused by the at least one controlled logic gate.

10. The method of claim 9, wherein the plurality of logic gates includes an odd number of inverting logic gates connected in a ring configuration, the at least one controlled logic gate includes an enable input that is the clock input, and wherein receiving the clock signal includes receiving the clock signal at the enable input.

11. The method of claim 9, wherein the at least one controlled logic gate includes a differential buffer gate having a non-inverted input and an inverted input, and at least an inverted output, the non-inverted input being connected to an output of a previous one of the plurality of logic gates in the ring configuration, the inverted input being the clock input, and the inverted output being connected to an input for a next one of the plurality of logic gates in the ring configuration, and wherein receiving the clock signal includes receiving the clock signal at the inverted input.

12. The method of claim 9, wherein the at least one controlled logic gate includes a tri-state inverter having an input connected to an output of a previous one of the plurality of logic gates in the ring configuration, an inverted output connected to an input of a next one of the plurality of logic gates in the ring configuration, and an enable input that is the clock input, and wherein receiving the clock signal includes receiving the clock signal at the enable input.

13. The method of claim 9, wherein the at least one controlled logic gate includes a gated D-latch having a data input and an enable input, and at least an inverted output, the data input being connected to an output of a previous one of the plurality of logic gates in the ring configuration, the enable input being the clock input, and the inverted output being connected to an input for a next one of the plurality of logic gates in the ring configuration, and wherein receiving the clock signal includes receiving the clock signal at the enable input.

14. The method of claim 9, wherein the at least one controlled logic gate includes a 2:1 multiplexer connected between consecutive logic gates of the plurality of logic gates in the ring configuration, the 2:1 multiplexer having a first input and a second input, a selector input and an output, the first input being connected to an output of an earlier one of the consecutive logic gates in the ring configuration, the selector input being the clock input, and the output being both connected to an input for a later one of the consecutive logic gates in the ring configuration, and fed back and connected to the second input of the 2:1 multiplexer, and wherein receiving the clock signal includes receiving the clock signal at the selector input.

15. The method of claim 9, wherein the clock signal has a clock frequency, and the method further comprising oscillating the ring oscillator at a frequency that is the clock frequency or a multiple of the clock frequency.

16. The method of claim 9, wherein the at least one controlled logic gate is multiple controlled logic gates each of which includes a respective clock input, wherein receiving the clock signal includes receiving the clock signal at the respective clock input of the multiple controlled logic gates, and wherein using clock signal includes using clock signal to control the multiple controlled logic gates and thereby synchronize the ring oscillator to the clock signal.

* * * * *